(12) United States Patent
Yamaguchi

(10) Patent No.: US 10,656,729 B2
(45) Date of Patent: May 19, 2020

(54) PRESSING DETECTOR AND ELECTRONIC DEVICE

(71) Applicant: Murata Manufacturing Co., Ltd., Nagaokakyo-shi, Kyoto-fu (JP)

(72) Inventor: Yoshihiro Yamaguchi, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 140 days.

(21) Appl. No.: 16/108,391

(22) Filed: Aug. 22, 2018

(65) Prior Publication Data

US 2018/0356912 A1 Dec. 13, 2018

Related U.S. Application Data

(63) Continuation of application No. PCT/JP2016/085269, filed on Nov. 29, 2016.

(30) Foreign Application Priority Data

Mar. 10, 2016 (JP) .................................. 2016-046497

(51) Int. Cl.
*G06F 3/0354* (2013.01)
*G01L 1/16* (2006.01)
(Continued)

(52) U.S. Cl.
CPC ............ *G06F 3/03545* (2013.01); *G01L 1/16* (2013.01); *G01L 1/2287* (2013.01);
(Continued)

(58) Field of Classification Search
CPC ......... G06F 3/03; G06F 3/03545; G01L 1/16; G01P 15/08
(Continued)

(56) References Cited

U.S. PATENT DOCUMENTS 4,555,953 A 12/1985 Dario et al.
9,778,765 B2 10/2017 Ishii et al.
(Continued)

FOREIGN PATENT DOCUMENTS

JP 2015097068 A 5/2015
WO 2013111841 A1 8/2013

OTHER PUBLICATIONS

International Search Report issued for PCT/JP2016/085269, dated Jan. 31, 2017.
(Continued)

*Primary Examiner* — Calvin C Ma
(74) *Attorney, Agent, or Firm* — Arent Fox LLP

(57) ABSTRACT

A pressing detector and an electronic device that properly corrects an integrated value at any timing. An electronic writing instrument includes a housing, an operation unit, and a pressing detector, which includes a plurality of electrodes, a piezoelectric film, a base material, a strain resistive element, a base material, a ground electrode, and a circuit including a detection unit. When an operation surface is displaced due to pressing or release of pressing by an operator, a resistance value of the strain resistive element changes. As a result, the strain resistive element performs an output according to an amount of displacement of the operation surface. The detection unit can thus correct the integrated value by the output of the strain resistive element. Therefore, the pressing detector can properly correct the integrated value at any timing.

20 Claims, 11 Drawing Sheets

(51) Int. Cl.
*G06F 3/03* (2006.01)
*G01L 1/22* (2006.01)
*G01L 5/00* (2006.01)
*H01L 41/193* (2006.01)

(52) U.S. Cl.
CPC .............. *G01L 5/0076* (2013.01); *G06F 3/03* (2013.01); *G06F 2203/04105* (2013.01); *H01L 41/193* (2013.01)

(58) Field of Classification Search
USPC ........................................ 345/173, 174, 179
See application file for complete search history.

(56) References Cited

U.S. PATENT DOCUMENTS

2014/0331791 A1* 11/2014 Ishii ................. G06F 3/038
73/862.625
2015/0226618 A1* 8/2015 Shih .................. G01L 1/16
310/338

OTHER PUBLICATIONS

Written Opinion of the International Searching Authority issued for PCT/JP2016/085269, dated Jan. 31, 2017.

* cited by examiner

PRESSING DETECTOR AND ELECTRONIC DEVICE

CROSS REFERENCE TO RELATED APPLICATIONS

The present application is a continuation of PCT/JP2016/085269 filed Nov. 29, 2016, which claims priority to Japanese Patent Application No. 2016-046497, filed Mar. 10, 2016, the entire contents of each of which are incorporated herein by reference.

TECHNICAL FIELD

The present disclosure relates to a pressing detector that detects an amount of pressing by an operator, and an electronic device including the pressing detector.

BACKGROUND

Various types of pressing detectors for detecting a pressing amount by the operator currently exist. For example, Patent Document 1 (identified below) discloses a conventional pressing detector that includes displacement sensor.

The displacement sensor of Patent Document 1 includes a piezoelectric element, a voltage conversion unit, and a detection unit. A voltage according to an amount of displacement is instantaneously generated from the piezoelectric element. The voltage conversion unit converts the voltage generated in the piezoelectric element into a voltage determined based on a pressing force and a predetermined time constant determined by an impedance of a resistor of the voltage conversion unit and capacitances of a capacitor and the piezoelectric element, and outputs the converted voltage. The detection unit integrates an output voltage of the voltage conversion unit and calculates an amount of pressing (pressing force) based on the integrated value.

However, when the displacement sensor uses the piezoelectric element here, an error also accumulates due to integration after the lapse of a certain time. As a result, the displacement sensor may erroneously detect that the operator is performing pressing although the operator is not actually performing pressing.

Therefore, in the displacement sensor described in Patent Document 1, after the integrated value of the voltage output from the voltage conversion unit becomes the maximum value, if a difference value obtained by differentiating between the initial integrated value and the latest integrated value is less than a predetermined threshold corresponding to the maximum value of the integrated value, the integrated value is corrected to the initial value.

Patent Document 1: International Publication No. WO 2013/111841.

As further described in Patent Document 1, the displacement sensor corrects the integrated value at the point in time when the integrated value of the voltage output from the voltage conversion unit becomes the maximum value. Thus, for example, when the operator releases the pressing before the integrated value becomes the maximum value, the integrated value is not reset to the initial value even if the difference value falls below the predetermined threshold value.

Therefore, the displacement sensor of Patent Document 1 has a problem of erroneously detecting that the operator is performing pressing, although the operator is not actually performing pressing.

SUMMARY OF THE INVENTION

Accordingly, an object of the exemplary embodiments of the present disclosure is to provide a pressing detector and an electronic device capable of properly correcting an integrated value at any timing.

Thus, a pressing detector according to an exemplary embodiment includes a piezoelectric element, a pressing detection unit, and a displacement detection element. The piezoelectric element generates an electric charge according to an amount of displacement of an operation surface. Moreover, the pressing detection unit calculates an integrated value of a voltage which is generated by the electric charge generated by the piezoelectric element. The displacement detection element performs an output according to the amount of displacement of the operation surface. The pressing detection unit intermittently operates the displacement detection element and inputs the output of the displacement detection element.

In this configuration, when the operation surface is displaced due to pressing or release of pressing by an operator, an electric charge according to an amount of displacement of the operation surface is generated in the piezoelectric element. As a result, the pressing detection unit calculates the integrated value of the voltage as an amount of pressing by the operator. Therefore, also in this configuration, an error accumulates due to the integration after the lapse of a certain time.

However, in this configuration, when the operation surface is displaced due to pressing or release of pressing by the operator, the displacement detection element performs an output according to the amount of displacement of the operation surface. Then, the pressing detection unit inputs the output of the displacement detection element.

Hence the pressing detection unit can correct the integrated value by the output of the displacement detection element. Therefore, the pressing detector of the exemplary embodiment can appropriately correct the integrated value at any timing.

Further, the pressing detection unit intermittently operates the displacement detection element, so that the pressing detector of the present invention can reduce the power consumption when time-averaged even when the power consumption of the displacement detection element is relatively large.

Moreover, the electronic device of the present disclosure includes the pressing detector of the exemplary embodiments described herein, thereby having the same effect as the pressing detector of the present invention.

Thus, according to the exemplary embodiments of the electronic device described herein, the integrated value can be properly corrected at any timing.

DETAILED DESCRIPTION OF EXEMPLARY EMBODIMENTS

Figure 1:
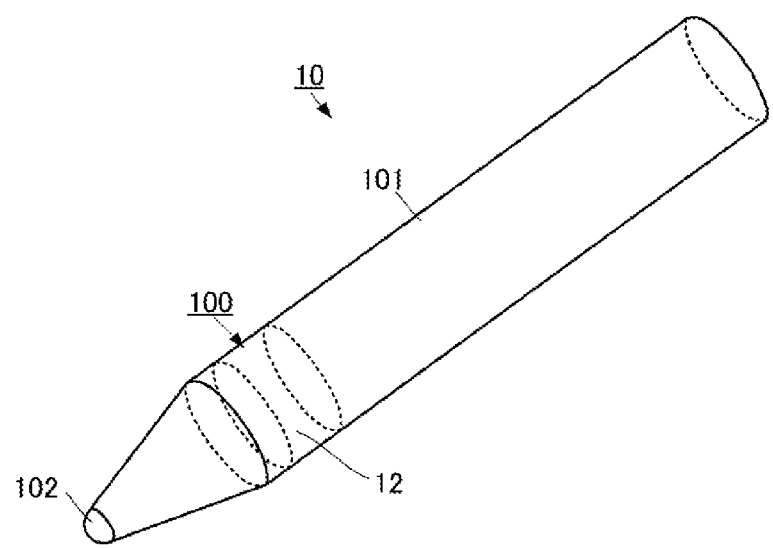
FIG. 1 is a perspective view of an electronic writing instrument 10 according to a first exemplary embodiment.
Figure 2:
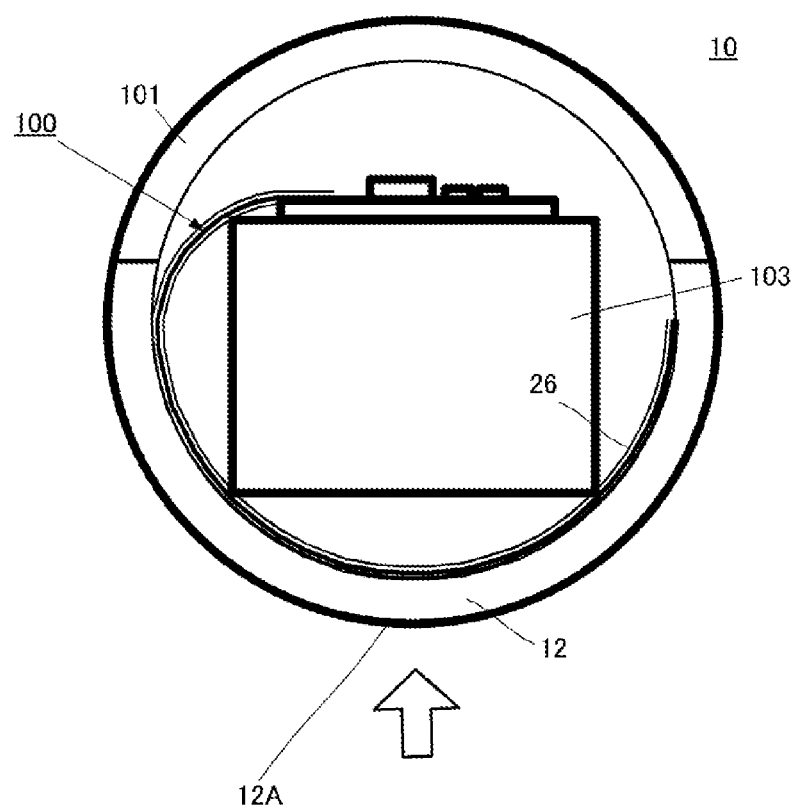
FIG. 2 is a sectional view of the electronic writing instrument 10 shown in FIG. 1.

An electronic writing instrument according to a first exemplary embodiment will be described with reference to the accompanying drawings. FIG. 1 is a perspective view of an electronic writing instrument 10 according to the first exemplary embodiment. FIG. 2 is a sectional view of the electronic writing instrument 10 shown in FIG. 1. FIG. 2 is a sectional view of a region where a pressing detector 100 is attached to the electronic writing instrument 10. An arrow in FIG. 2 indicates a direction in which an operator preforms pressing.

As shown in FIG. 1, the electronic writing instrument 10 includes a housing 101, an operation unit 12, and a pressing detector 100.

It is noted that the electronic writing instrument 10 corresponds to an example of the electronic device of the present disclosure.

According to the exemplary embodiment, the housing 101 has a cylindrical shape and is made of an insulating material. As shown in FIG. 2, a support 103 is provided inside the housing 101. The tip of the housing 101 in a longitudinal direction (a direction orthogonal to a circumferential direction/plane) is an end 102 having a tapered shape as shown in FIG. 1.

It is noted that the housing 101 can only have a strength (rigidity) to the extent that its deformation can be transmitted to the pressing detector 100, and the housing 101 may be made of metal.

The operation unit 12 forms a part of the housing 101. The operation unit 12 has an operation surface 12A as shown in FIG. 2 that receives an input of pressing by the operator. Preferably, the operation unit 12 is made of a material having flexibility. A material for the operation unit 12 is, for example, a resin.

The pressing detector 100 includes a base material 26. The base material 26 has flexibility. A material for the base material 26 is, for example, a polyimide resin or the like. As shown in FIG. 2, the pressing detector 100 is attached to an inner wall surface of the operation unit 12 in the state of being curved along the circumferential direction of the inner wall surface (or at least a portion thereof) of the operation unit 12. Therefore, at each location of the pressing detector 100, a bending load is generated as the base material 26 bends.

Next, the configuration of the pressing detector 100 will be described.

Figure 3:
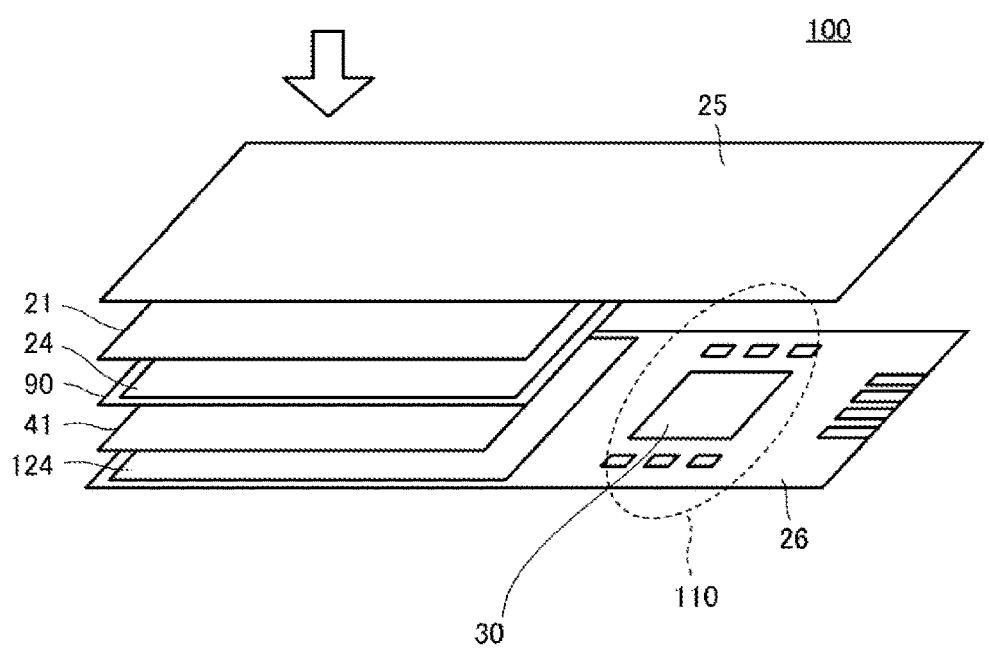
FIG. 3 is an exploded perspective view of a pressing detector 100 shown in FIG. 2.
Figure 4:
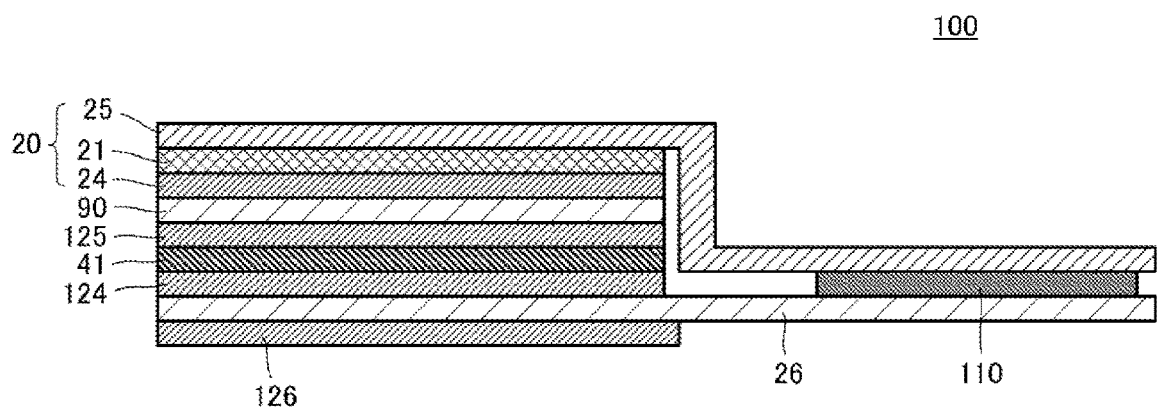
FIG. 4 is a schematic sectional view of a pressing detector 100 shown in FIG. 2.

FIG. 3 is an exploded perspective view of the pressing detector 100 shown in FIG. 2. FIG. 4 is a schematic sectional view of the pressing detector 100 shown in FIG. 2. Note that an arrow in FIG. 3 indicates a direction in which the operator performs pressing.

As shown in FIGS. 3 and 4, the pressing detector 100 includes an electrode 25 (e.g., a first electrode), a piezoelectric film 21, an electrode 24 (e.g., a second electrode), a base material 90, an electrode 125 (e.g., a third electrode), a strain resistive element 41, an electrode 124 (e.g., a fourth electrode), a base material 26, a ground electrode 126, and a circuit 110 including a detection unit 30.

It is noted that the detection unit 30 corresponds to an example of the pressing detection unit of the present disclosure. The strain resistive element 41 corresponds to an example of the displacement detection element of the present disclosure.

As shown, the circuit 110 including the detection unit 30 and the electrode 124 are mounted on the front surface of the base material 26 as shown in FIG. 4. The ground electrode 126 is mounted on the rear surface of the base material 26. Preferably, the electrode 124 and the ground electrode 126 are each made of a metal film such as copper foil. Moreover, the base material 26 forms a flexible printed circuit board as shown in FIG. 3.

It is noted that the ground electrode 126 can reduce the influence of external noise entering from the rear surface side of the base material 26.

The electrode 24 is mounted on the front surface of the base material 90. The electrode 125 is mounted on the rear surface of the base material 90. The electrode 24 and the electrode 125 are made of a metal film such as a copper foil. The base material 90 forms a flexible printed circuit board. The base material 26 and the base material 90 are connected via wires (not shown).

Both surfaces of the strain resistive element 41 are electrically connected to the electrode 124 and the electrode 125. Both surfaces of the piezoelectric film 21 are electrically connected to the electrode 24 and the electrode 25. The electrode 25 is made of a conductive tape such as a copper foil. The piezoelectric film 21, the electrode 24, and the electrode 25 constitute a piezoelectric element 20.

Each of the electrode 124, the electrode 125, the electrode 24, and the electrode 25 is electrically connected to the circuit 110.

A material for the piezoelectric film 21 is, for example, L-type polylactic acid (PLLA). PLLA is a chiral polymer and has a main chain with a helical structure. PLLA has piezoelectricity when PLLA is uniaxially stretched and molecules are oriented. A piezoelectric constant of uniaxially stretched PLLA belongs to a group of very high piezoelectric constants among polymers.

It is noted that the piezoelectric film 21 is not limited to a film mainly made up of PLLA but may be a film made of other chiral polymers such as D-type polylactic acid (PDLA) or poly-γ-benzyl-L-glutamate (PBLG).

However, the piezoelectricity of the piezoelectric film 21 mainly made up of the chiral polymer such as PLLA or PDLA is not exhibited by ion polarization as in ferroelectrics such as polyvinylidene fluoride (PVDF) and lead zirconate titanate (PZT), but is derived from a helical structure which is a characteristic structure of molecules.

For this reason, PLLA generates piezoelectricity as a result of molecule orientation processing by stretching or the like and does not require polling processing unlike other polymers such as PVDF or piezoelectric ceramics. That is, the piezoelectricity of PLLA not belonging to ferroelectrics is exhibited not by ion polarization as in ferroelectrics such as PVDF and PZT, but derives from the helical structure which is the characteristic structure of molecules.

Hence PLLA does not generate pyroelectricity that is generated by other ferroelectric piezoelectric bodies. The piezoelectric constant of PVDF or the like temporally fluctuates and, in some cases, remarkably decreases, whereas the piezoelectric constant of PLLA is temporally very stable.

When a third axis is taken in an extending direction of PLLA and a first axis and a second axis are taken in directions vertical to the third axis direction, piezoelectric constant $d_{14}$ (shear piezoelectric constant) exists in PLLA. That is, the PLLA is a piezoelectric body having shear piezoelectricity. The piezoelectric film 21 in a stripe shape is cut out such that the first axis direction is a thickness direction and a direction forming an angle of 45° with respect to the third axis direction (extending direction) is the longitudinal direction. As a result, when the piezoelectric film 21 extends and contracts in the longitudinal direction, the piezoelectric film 21 is polarized in the thickness direction.

It is most effective that the first axis direction is 45°, but substantially the same effect can be obtained even when the first axis direction is in the range of 45±10°, for example.

As described above, each of the electrode 25, the piezoelectric film 21, the electrode 24, the base material 90, the electrode 125, the strain resistive element 41, the electrode 124, the base material 26, and the ground electrode 126 is laminated so as to be parallel to the operation surface 12A and is fixed to the inner wall surface of the operation unit 12 according to the exemplary embodiment.

Further, the piezoelectric element 20 and the strain resistive element 41 overlap with each other as viewed from the front side of the operation surface 12A. The piezoelectric element 20 and the strain resistive element 41 are located at the center of the operation surface 12A as viewed from the front side of the operation surface 12A.

Therefore, when the operation surface 12A is displaced due to pressing or release of pressing by the operator, the strain resistive element 41 and the piezoelectric film 21 are displaced. The amount of displacement of the piezoelectric film 21 is the same as the amount of displacement of the operation surface 12A. The amount of displacement of the strain resistive element 41 is the same as the amount of displacement of the operation surface 12A.

Figure 5:
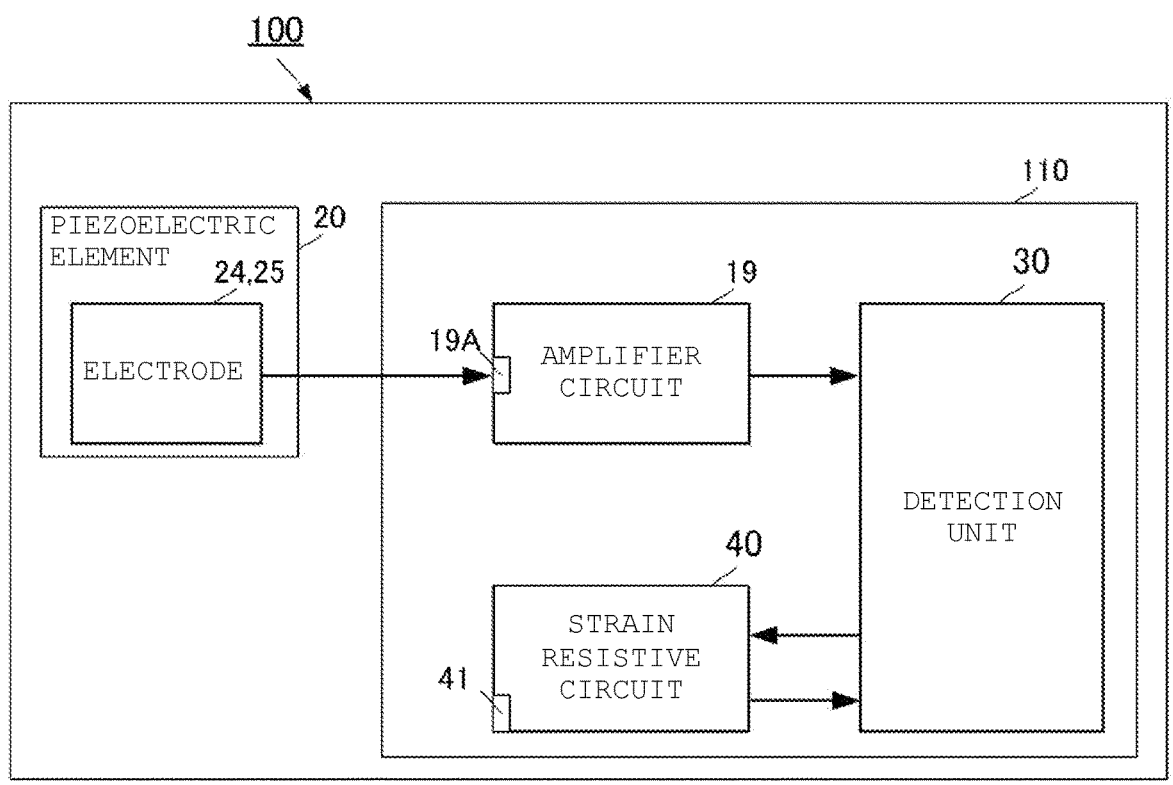
FIG. 5 is a block diagram of the pressing detector 100 shown in FIG. 1.
Figure 6:
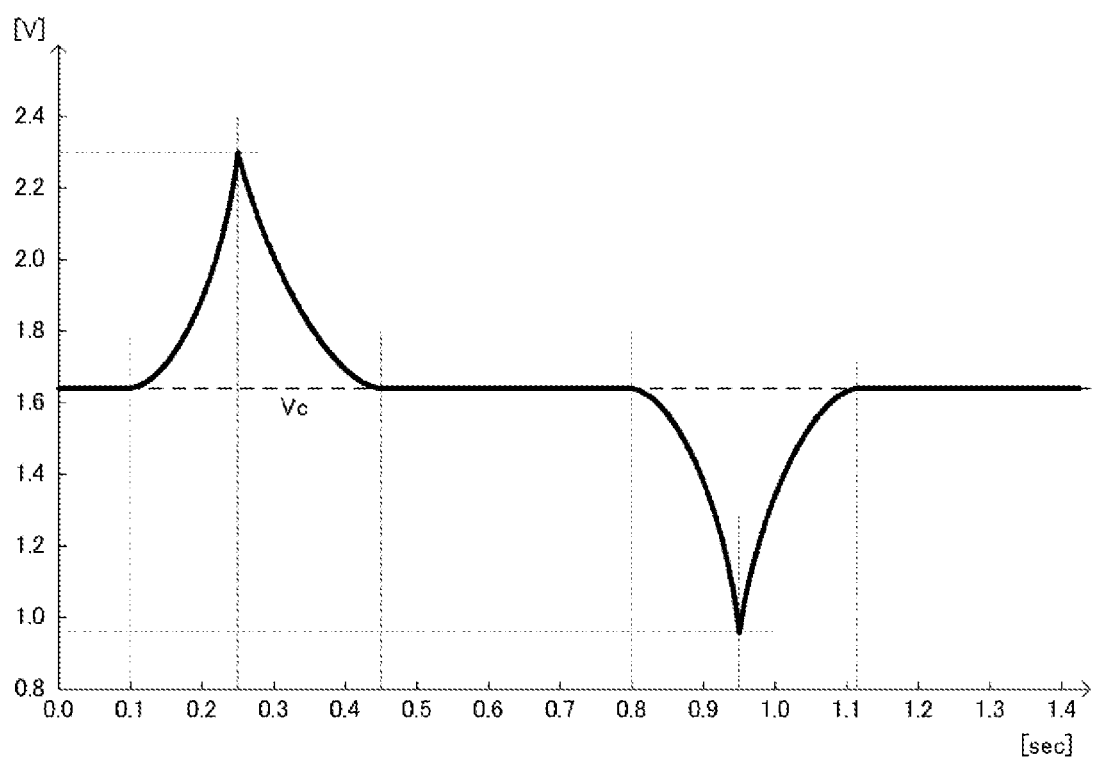
FIG. 6 is a graph showing an example of the relationship between an elapsed time and an output voltage of an amplifier circuit 19 shown in FIG. 5.
Figure 7:
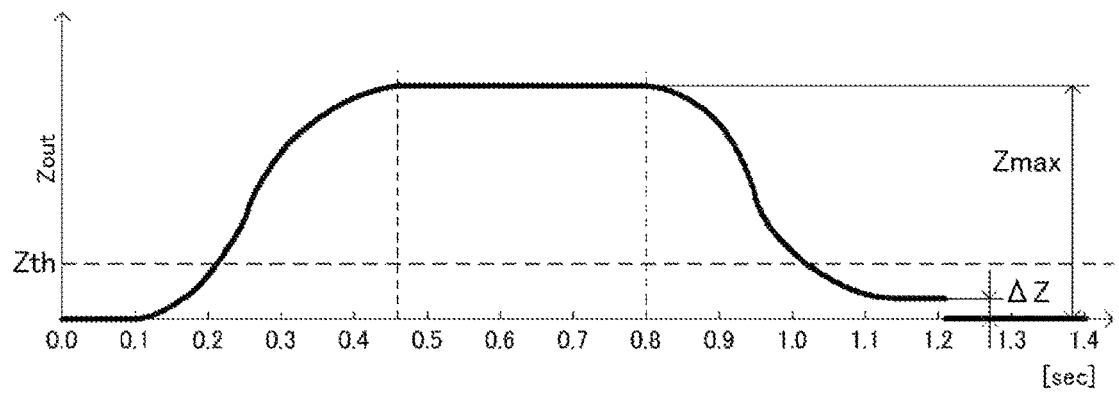
FIG. 7 is a graph showing an example of the relationship between the elapsed time and an integrated value of a difference between a reference value and the output voltage in the amplifier circuit 19 shown in FIG. 5.
Figure 8:
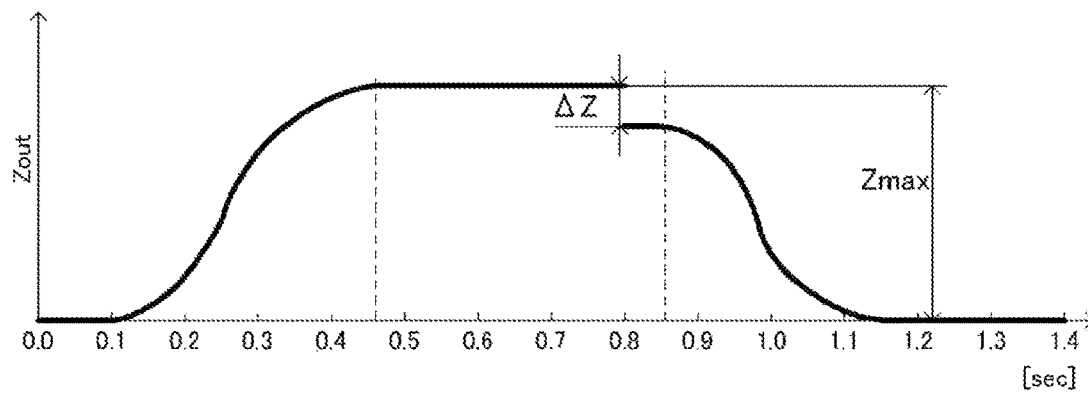
FIG. 8 is a graph showing an example of the relationship between the elapsed time and the integrated value of the difference between the reference value and the output voltage in the amplifier circuit 19 shown in FIG. 5.

FIG. 5 is a block diagram of the pressing detector 100 shown in FIG. 1. FIG. 6 is a graph showing an example of the relationship between an elapsed time and an output voltage of an amplifier circuit 19 shown in FIG. 5. FIG. 7 is a graph showing an example of the relationship between the elapsed time and an integrated value of a difference between a reference value and the output voltage in the amplifier circuit 19 shown in FIG. 5. FIG. 8 is a graph showing an example of the relationship between the elapsed time and the integrated value of the difference between the reference value and the output voltage in the amplifier circuit 19 shown in FIG. 5.

As shown in FIG. 5, the pressing detector 100 includes the piezoelectric element 20, the amplifier circuit 19, a strain resistive circuit 40 including the strain resistive element 41, and the detection unit 30. According to an exemplary aspect, the amplifier circuit 19, the strain resistive circuit 40, and the detection unit 30 form the circuit 110.

When the operator presses the operation surface 12A, the operation unit 12 bends so as to be convex in the pressed direction. As a result, the piezoelectric element 20 also bends so as to be convex in the pressing direction. Similarly, when the operator releases the pressing against the operation surface 12A, the operation unit 12 is displaced in a direction opposite to the direction in which the operation unit 12 has been pressed and returns to the original shape. The piezoelectric element 20 is also displaced in the direction opposite to the direction in which the operation unit 12 has been pressed and returns to the original shape.

Therefore, when the operator presses the operation surface 12A, or when the operator releases the pressing against the operation surface 12A, the piezoelectric film 21 is polarized in the thickness direction due to the piezoelectric effect. As a result, electric charges are induced in the electrodes 24 and 25. The electric charges generated at the electrodes 24 and 25 are output to the amplifier circuit 19.

The amplifier circuit 19 includes a charge amplifier 19A. The charge amplifier 19 converts the electric charge generated in the piezoelectric element 20 into a voltage. The amplifier circuit 19 amplifies the voltage converted in the charge amplifier 19 and outputs the converted voltage to the detection unit 30.

The detection unit 30 can include a microcomputer, for example, according to an exemplary aspect. As shown in FIG. 6, the detection unit 30 integrates a difference between the voltage outputted from the amplifier circuit 19 and a reference voltage Vc, and calculates an integrated value as shown in FIGS. 7 and 8. The detection unit 30 is configured to calculate from the integrated value an amount of displacement of the operation surface 12A as an amount of pressing by the operator.

In this aspect, the charge amplifier 19 converts the electric charge generated in the piezoelectric element 20 into a voltage proportional to the differential of the electric charge generated in the piezoelectric element 20. Therefore, in order to detect the amount of pressing, the pressing detector 100 needs to integrate the voltage output from the amplifier circuit 19 in the detection unit 30.

Therefore, in the case of using the piezoelectric element 20, there is a problem of accumulation of an error ΔZ due to integration as shown in FIGS. 7 and 8 after the lapse of a certain time. As a result, the pressing detector 100 may erroneously detect that the operator is performing pressing, although the operator is not performing pressing.

Therefore, according to the exemplary embodiment the pressing detector 100 includes the strain resistive element 41. In an exemplary aspect, the strain resistive element 41 is an element, a resistance value of which changes according to the amount of displacement of the operation surface 12A. The amount of change in the resistance value of the strain resistive element 41 is small, and hence it is preferable to use a Wheatstone bridge circuit shown in FIG. 9.

Figure 9:
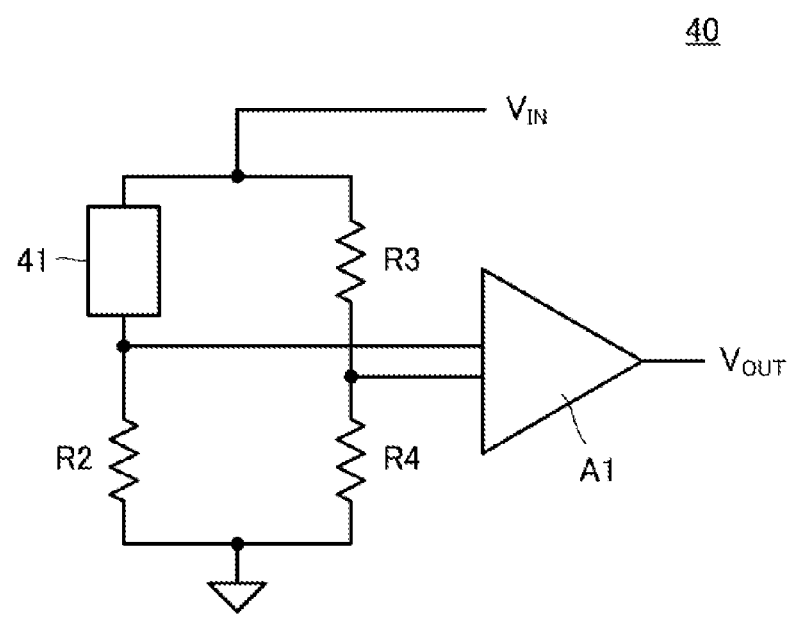
FIG. 9 is a circuit diagram showing an example of a strain resistive circuit 40 shown in FIG. 5.

FIG. 9 is a circuit diagram showing an example of the strain resistive circuit 40 shown in FIG. 5. The strain resistive circuit 40 includes the strain resistive element 41, a resistor R2, a resistor R3, a resistor R4, and a differential amplifier A1. The strain resistive circuit 40 is formed by the Wheatstone bridge circuit.

In the strain resistive circuit 40, the respective resistance values of the strain resistive element 41, the resistor R2, the resistor R3, and the resistor R4 are the same. A line connecting the strain resistive element 41 and the resistor R2 and a line connecting the resistor R3 and the resistor R4 are respectively connected to input terminals of the differential amplifier A1. An output terminal of the differential amplifier A1 is connected to the detection unit 30.

In the above circuit, a drive voltage $V_{IN}$ supplied from the detection unit 30 is divided by the strain resistive element 41 and the resistor R2, and a first resistive divided voltage is input into the differential amplifier A1. Similarly, the drive voltage is divided by the resistor R3 and the resistor R4, and a second resistive divided voltage is input into the differential amplifier A1. A difference between the first resistive divided voltage and the second resistive divided voltage is amplified by the differential amplifier A1, and the differential amplifier A1 outputs a voltage Vout to the detection unit 30.

Here, when the operation surface 12A is displaced due to pressing or release of pressing by the operator, the strain resistive element 41 extends in the longitudinal direction of the strain resistive element 41 according to the displacement of the operation unit 12. This leads to reduction in cross-sectional area of the strain resistive element 41 and an increase in a resistance value of the strain resistive element 41. That is, when the operation surface 12A is displaced due to pressing or release of pressing by the operator, the resistance value of the strain resistive element 41 changes.

Thereby, the strain resistive circuit 40 outputs a voltage according to the amount of displacement of the operation surface 12A from the differential amplifier A1. That is, the strain resistive element 41 performs an output (i.e., generates an output value) according to the amount of displacement of the operation surface 12A. Then, the detection unit 30 inputs the output of the strain resistive element 41.

Therefore, the detection unit 30 is configured to correct the integrated value by the output value generated by the strain resistive element 41 (specifically, the value of the voltage output from the strain resistive circuit 40). For example, as shown in FIGS. 7 and 8, the detection unit 30 can correct the error ΔZ to the initial value 0 by the output of the strain resistive element 41 (specifically, the value of the voltage output from the strain resistive circuit 40). Thus, in the pressing detector 100, for example, even when the operator releases the pressing before the integrated value becomes the maximum value, the integrated value is reset to the initial value.

Therefore, the pressing detector 100 can properly correct the integrated value at any timing.

It is noted that the strain resistive element 41 can detect the amount of pressing with an absolute value, and hence the error ΔZ does not accumulate unlike the piezoelectric element 20.

However, the strain resistive element 41 is an element that detects the amount of pressing by a change in the resistance value. The resistance value of the strain resistive element 41 is about several hundred Ω to several kΩ. For this reason, the sensitivity of the strain resistive element 41 decreases as the current consumption is reduced. The strain resistive element 41 has a disadvantage of requiring large power consumption in practical use.

Therefore, the detection unit 30 intermittently operates the strain resistive element 41. This enables the pressing detector 100 to reduce the power consumption. Further, the electronic writing instrument 10 also includes the pressing detector 100 and thus has the same effect as the pressing detector 100.

Here, when the strain resistive element 41 is operated intermittently, there is a problem that the detection unit 30 cannot obtain, from the strain resistive circuit 40, pressing data during the time when the strain resistive element 41 is not operated. However, the detection unit 30 can continuously obtain from the piezoelectric element 20 the pressing data during the time when the strain resistive element 41 is not operating.

For the above reasons, the pressing detector 100 includes both the strain resistive element 41 and the piezoelectric element 20 according to the exemplary embodiment.

It is noted that the detection unit 30 preferably corrects the integrated value at the timing when the operator is not performing pressing or not releasing the pressing. For example, as shown in FIG. 7, the detection unit 30 preferably corrects the integrated value when the integrated value is equal to or less than a predetermined value $Z_{th}$.

Figure 10:
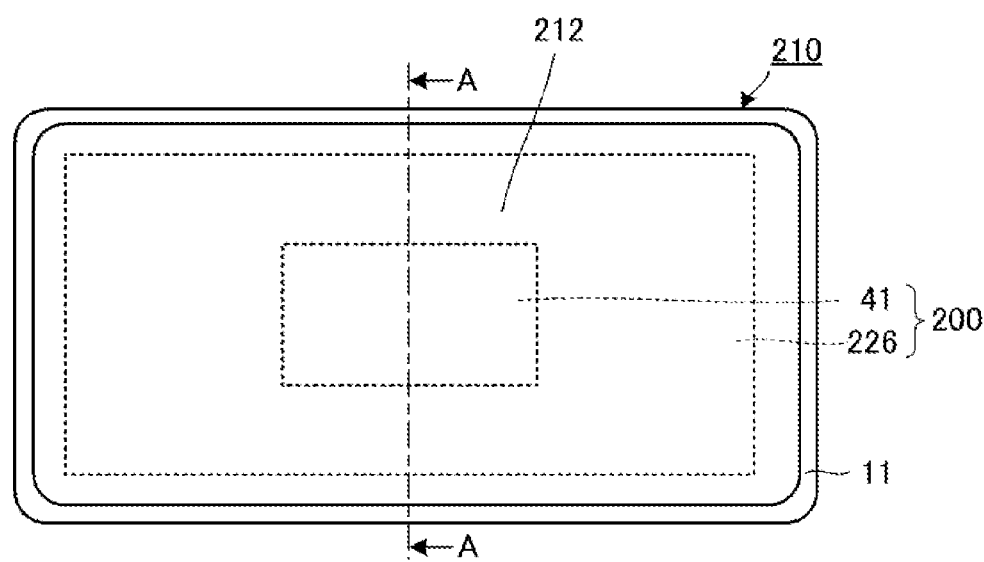
FIG. 10 is a front view of a smartphone 210 according to a second exemplary embodiment.
Figure 10:
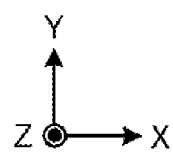
Figure 11:
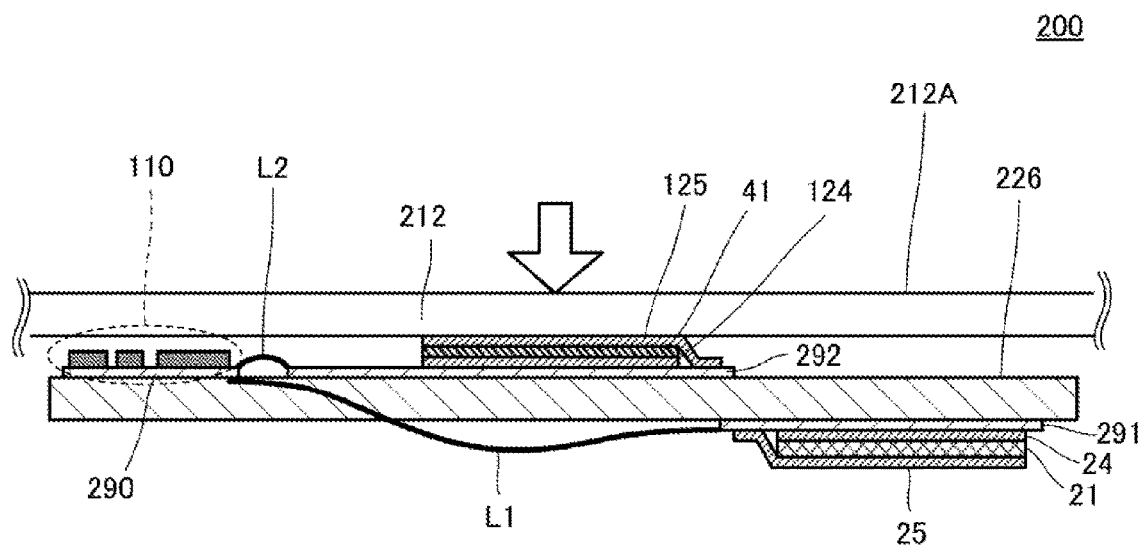
FIG. 11 is a sectional view along line A-A shown in FIG. 10.

Hereinafter, a smartphone according to a second exemplary embodiment of the present disclosure will be described with reference to the drawings. FIG. 10 is a front view of a smartphone 210 according to the second exemplary embodiment. FIG. 11 is a sectional view along a line A-A shown in FIG. 10. An arrow in FIG. 11 indicates a direction in which the operator performs pressing.

The smartphone 210 includes a housing 11, an operation plate 212, and a pressing detector 200.

It is noted that the smartphone 210 corresponds to an example of the electronic device of the present disclosure.

The housing 11 is made up of a frame-shaped side plate and a rectangular bottom plate and has a rectangular opening on the upper surface. The operation plate 212 is bonded to the housing 11 so as to close the opening of the housing 11. Hence the housing 11 and the operation plate 212 accommodate the pressing detector 200.

The operation plate 212 has an operation surface 212A for receiving an input of pressing by an operator. A material for the operation plate 212 is, for example, glass or Flame Retardant Type 4 (FR-4).

As shown in FIG. 11, the pressing detector 200 includes the electrode 25, the piezoelectric film 21, the electrode 24, the electrode 125, the strain resistive element 41, the electrode 124, a base material 290, a base material 291, a base material 292, the circuit 110 including the detection unit 30, and a support plate 226. It is noted that description of members having the same configuration as the pressing detector 100 is omitted.

The circuit 110 including the detection unit 30 is mounted on the front surface of the base material 290. The base material 290 constitutes a flexible printed circuit board. The rear surface of the base material 290 is bonded to the front surface of the support plate 226.

The electrode 25, the piezoelectric film 21, and the electrode 24 are mounted on the rear surface of the base material 291. The base material 291 constitutes a flexible printed circuit board. The front surface of the base material 291 is bonded to the rear surface of the support plate 226. The base material 291 is connected to the base material 290 via a wire L1. Therefore, the electrode 24 and the electrode 25 are electrically connected to the circuit 110 via the wire L1.

The electrode 125, the strain resistive element 41, and the electrode 124 are mounted on the front surface of the base material 292. The base material 292 constitutes a flexible printed circuit board. The rear surface of the base material 292 is bonded to the front surface of the support plate 226. The base material 292 is connected to the base material 290 via a wiring L2. Therefore, the electrode 124 and the electrode 125 are electrically connected to the circuit 110 via the wiring L2.

As described above, each of the operation plate 212, the electrode 125, the strain resistive element 41, the electrode 124, the base material 292, the support plate 226, the base material 291, the electrode 25, the piezoelectric film 21, the electrode 24 is laminated so as to be parallel to the operation surface 212A. The strain resistive element 41 is located at the center of the operation surface 12A as viewed from the front side of the operation surface 12A. The support plate 226 is fixed to the inner wall surface of the housing 11.

In the pressing detector 100, the piezoelectric element 20 and the strain resistive element 41 overlap with each other as viewed from the front side of the operation surface 12A, but in the pressing detector 200, the piezoelectric element 20 and the strain resistive element 41 do not overlap with each other as viewed from the front side of the operation surface 212A.

When the operator presses the operation surface 212A, the operation plate 212 bends so as to be convex in the pressed direction. The support plate 226 also bends so as to be convex in the pressing direction. Similarly, when the operator releases the pressing against the operation surface 212A, the operation plate 212 is displaced in a direction opposite to the direction in which the operation plate 212 has been pressed and returns to the original shape. The support plate 226 is also displaced in the direction opposite to the direction in which the operation plate 212 has been pressed and returns to the original shape.

Along with the deformation of the support plate 226, the strain resistive element 41 and the piezoelectric film 21 are also deformed. The amount of displacement of the strain resistive element 41 is the same as the amount of displacement of the operation surface 212A. Although the amount of displacement of the piezoelectric film 21 is proportional to the amount of displacement of the operation surface 212A, the amount of displacement of the piezoelectric film 21 is small as compared with the amount of displacement of the operation surface 212A.

However, the sensitivity of the piezoelectric film 21 is higher than the sensitivity of the strain resistive element 41, and hence the piezoelectric film 21 may not be located at the center of the operation surface 212A as viewed from the front side of the operation surface 212A.

Here, the pressing detector 200 includes the strain resistive element 41. Thus, when the operation surface 212A is displaced due to pressing or release of pressing by the operator, the resistance value of the strain resistive element 41 changes. Therefore, the strain resistive element 41 performs an output according to the amount of displacement of the operation surface 212A. Then, the detection unit 30 inputs the output of the strain resistive element 41.

Therefore, the detection unit 30 is configured to correct the integrated value by the output of the strain resistive element 41 (specifically, the value of the voltage output from the strain resistive circuit 40). For example, as shown in FIGS. 7 and 8, the detection unit 30 can correct the error $\Delta Z$ to the initial value 0 by the output of the strain resistive element 41 (specifically, the value of the voltage output from the strain resistive circuit 40).

Therefore, like the pressing detector 100, the pressing detector 200 can properly correct the integrated value at any timing.

Further, the detection unit 30 intermittently operates the strain resistive element 41. This enables the pressing detector 200 to reduce the power consumption, like the pressing detector 100.

Further, the smartphone 210 also includes the pressing detector 200 and thus has the same effect as the pressing detector 200.

In the exemplary embodiment described above, the electronic writing instrument 10 and the smartphone 210 have been shown as examples of the electronic device, but the present disclosure is not limited thereto. In practice, the application to other electronic devices, such as a mouse and a tablet terminal, is also possible.

In the exemplary embodiment described above, each of the pressing detectors 100, 200 is provided with the piezoelectric film 21 of polylactic acid, but the present disclosure is not limited thereto. In practice, the pressing detector can also include other piezoelectric films such as PVDF.

Further, for example as shown in FIG. 9, each of the pressing detectors 100, 200 is provided with the strain resistive circuit 40 including the strain resistive element 41, but the exemplary embodiments of the present disclosure are not limited thereto. In practice, for example, instead of the strain resistive circuit 40, the pressing detector may be provided with a resistive circuit 140 shown in FIG. 12.

Figure 12:
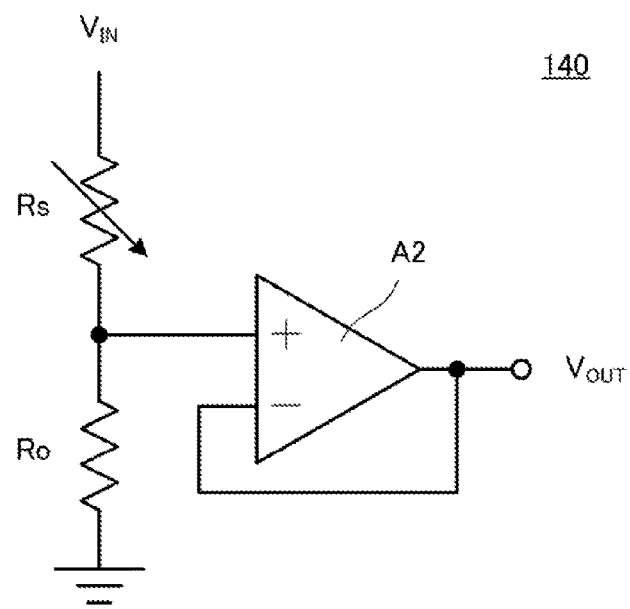
FIG. 12 is a circuit diagram showing an example of a resistive circuit 140 according to a modification of the strain resistive circuit 40 shown in FIG. 9.

FIG. 12 is a circuit diagram showing an example of the resistive circuit 140 according to a modification of the strain resistive circuit 40. The resistive circuit 140 includes a resistor Ro, a resistive element Rs, and a differential amplifier A2. As shown, a line connecting the resistor Ro and the resistive element Rs is connected to a non-inverting input terminal of the differential amplifier A2. An output terminal of the differential amplifier A2 is connected to an inverting input terminal of the differential amplifier A2 and the detection unit 30.

In the above circuit, a drive voltage $V_{IN}$ supplied from the detection unit 30 is divided by the resistor Ro and the resistive element Rs, and the resistive divided voltage is input into the non-inverting input terminal of the differential amplifier A2. Similarly, an output voltage of the differential amplifier A2 is input into the inverting input terminal of the differential amplifier A2. A difference between the resistive divided voltage and the output voltage is amplified in the differential amplifier A2, and the differential amplifier A2 outputs a voltage Vout to the detection unit 30.

Here, the resistive element Rs is an element using polymer thick film ink. When the operation surface is displaced due to pressing or release of pressing by the operator, the resistance value of the resistive element Rs changes.

Figure 13:
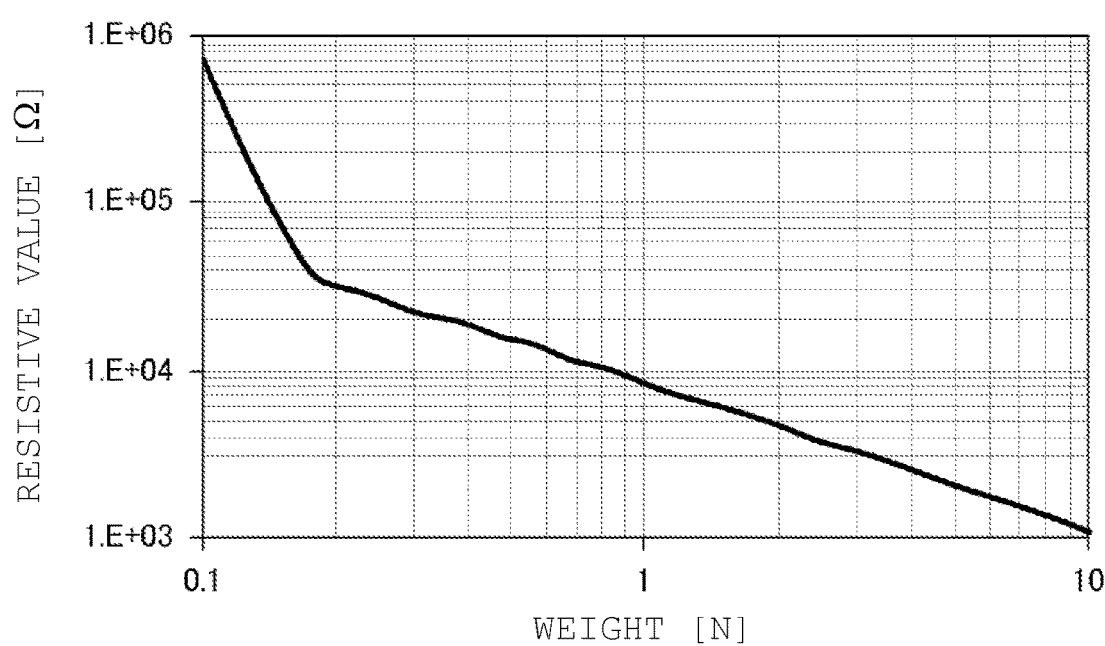
FIG. 13 is a circuit diagram showing an example of the relationship between a weight applied to a resistive element Rs shown in FIG. 12 and a resistance value.
Figure 14:
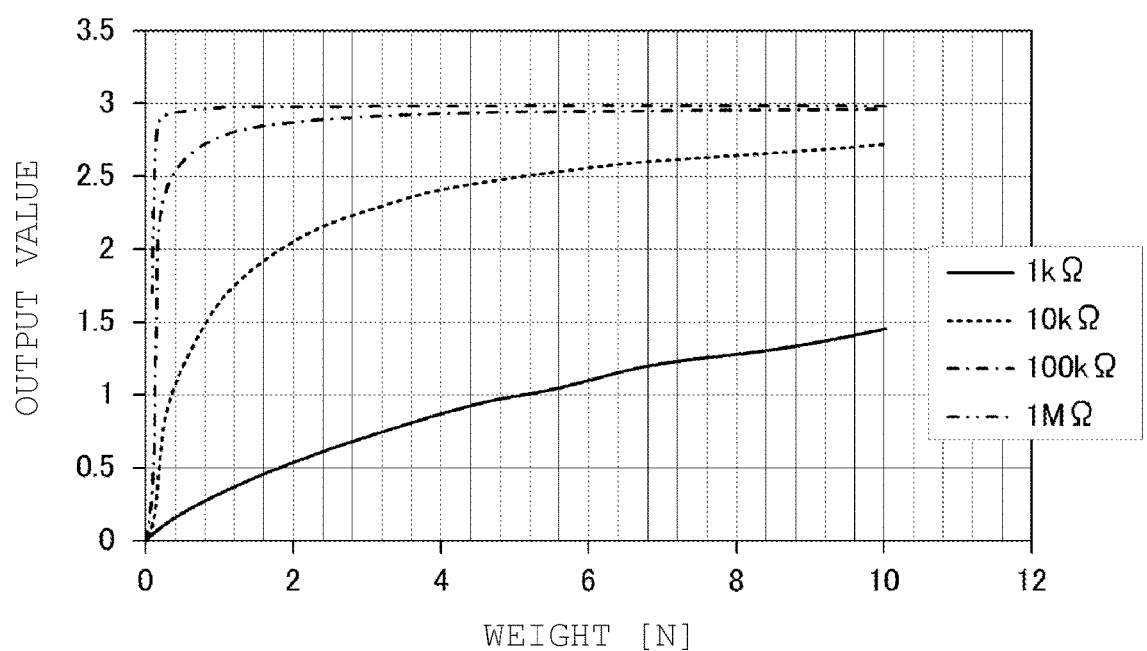
FIG. 14 is a circuit diagram showing an example of the relationship between the weight applied to the resistive element Rs shown in FIG. 12 and the output voltage of the resistive circuit 140.

FIG. 13 is a circuit diagram showing an example of the relationship between a weight applied to the resistive element Rs shown in FIG. 12 and a resistance value. FIG. 14 is a circuit diagram showing an example of the relationship between the weight applied to the resistive element Rs shown in FIG. 12 and the output voltage of the resistive circuit 140. FIG. 14 shows four graphs according to the resistance value of the resistive element Rs. FIGS. 13 and 14 show graphs when the drive voltage $V_{IN}$ is 3 V.

As shown in FIG. 14, when the resistance value of the resistive element Rs is as large as, for example, 1 MΩ, the consumption current decreases to about several uA, for example, but the output voltage of the resistive circuit 140 rises sharply. Therefore, the detection unit 30 can only detect two values of "pressed" and "not pressed".

In contrast, when the resistance value of the resistive element Rs is as small as, for example, 1 kΩ, the resistive circuit 140 outputs a voltage according to the amount of pressing. In this case, the detection unit 30 can detect the amount of pressing in detail, but a current of about several hundred uA to several mA flows through the resistive circuit 140. The resistive element Rs thus has a disadvantage that the power consumption becomes comparatively large, similarly to the strain resistive element 41 described above.

Therefore, the detection unit 30 intermittently operates the resistive element Rs. This enables the resistive circuit 140 to reduce the power consumption, like the strain resistive circuit 40.

The strain resistive element 41 is an element for detecting distortion, like the piezoelectric film 21. The strain resistive element 41 thus has a feature of being easy to use in combination with the piezoelectric film 21. On the other hand, the resistive element Rs using the polymer thick film ink is an element which directly detects a vertical force. Hence the amount of change in the resistance value of the resistive element Rs is large. The resistive element Rs thus has a feature of being easy to handle.

Finally, it is noted that the description of each of the above exemplary embodiments should be considered as being illustrative in all respects and not being restrictive. The scope of the present invention is shown by the claims rather than by the embodiments described above. Further, the scope of the present invention includes an equivalent scope to the scope of the claims.

DESCRIPTION OF REFERENCE SYMBOLS

10: ELECTRONIC WRITING INSTRUMENT
11: HOUSING
12: OPERATION UNIT
12A: OPERATION SURFACE
19: AMPLIFIER CIRCUIT
19A: CHARGE AMPLIFIER
20: PIEZOELECTRIC ELEMENT
21: PIEZOELECTRIC FILM
24, 25: ELECTRODE
26: BASE MATERIAL
30: DETECTION UNIT
40: RESISTIVE CIRCUIT
41: RESISTIVE ELEMENT
90: BASE MATERIAL
100: PRESSING DETECTOR
101: HOUSING
102: END
103: SUPPORT
110: CIRCUIT
124, 125: ELECTRODE
126: GROUND ELECTRODE
140: RESISTIVE CIRCUIT
200: PRESSING DETECTOR
210: SMARTPHONE
212: OPERATION PLATE
212A: OPERATION SURFACE
226: SUPPORT PLATE
290, 291, 292: BASE MATERIAL

The invention claimed is:

1. A pressing detector, comprising:
a piezoelectric element configured to generate an electric charge based on an amount of displacement of an operation surface;
a displacement detection element configured to generate an output value based on the amount of the displacement of the operation surface; and
a pressing detection unit configured to:
calculate an integrated value of a voltage generated by the electric charge generated by the piezoelectric element,
intermittently operate the displacement detection element, and
correct the calculated and integrated value of the voltage based on the output value generated by the displacement detection element.

2. The pressing detector according to claim 1, wherein the pressing detection unit is configured to correct the integrated value when the calculated and integrated value is equal to or less than a predetermined value.

3. The pressing detector according to claim 1, wherein the piezoelectric element overlaps with the displacement detection element as viewed from a front side of the operation surface.

4. The pressing detector according to claim 1, wherein the displacement detection element is positioned at a center of the operation surface as viewed from a front side of the operation surface.

5. The pressing detector according to claim 1, wherein the piezoelectric element comprises a polylactic acid film.

6. The pressing detector according to claim 1, wherein the displacement detection element is strain resistive circuit having a resistance value that changes proportionally based on the amount of displacement of the operation surface.

7. The pressing detector according to claim 1, wherein the displacement detection element is a Wheatstone bridge circuit configured to generate a resistance value as the output value that changes proportionally based on the amount of displacement of the operation surface.

8. The pressing detector according to claim 7, wherein the pressing detection unit intermittently operates the Wheatstone bridge circuit by intermittently applying a drive voltage thereto.

9. The pressing detector according to claim 8, wherein the pressing detection unit is configured to continuously obtain pressing data from the piezoelectric element when the Wheatstone bridge circuit is not operating, such that the pressing detection unit can continuously correct the calculated and integrated value of the voltage generated by the electric charge generated by the piezoelectric element.

10. A pressing detector, comprising:
a piezoelectric element configured to generate an electric charge by a pressing of an operation surface;
a resistive element having a resistance value that changes based on a pressing amount of the operation surface; and
a pressing detection unit configured to:
calculate an integrated value of a voltage generated by the electric charge generated by the piezoelectric element,
intermittently operate the resistive element, and
correct the calculated and integrated value of the voltage based on the resistance value of the resistive element.

11. The pressing detector according to claim 10, wherein the pressing detection unit is configured to correct the integrated value when the calculated and integrated value is equal to or less than a predetermined value.

12. The pressing detector according to claim 10, wherein the piezoelectric element overlaps with the resistive element as viewed from a front side of the operation surface.

13. The pressing detector according to claim 10, wherein the resistive element is positioned at a center of the operation surface as viewed from a front side of the operation surface.

14. The pressing detector according to claim 10, wherein the piezoelectric element comprises a polylactic acid film.

15. The pressing detector according to claim 10, wherein the resistive element is strain resistive circuit having a resistance value that changes proportionally based on the amount of displacement of the operation surface.

16. The pressing detector according to claim 10, wherein the resistive element is a Wheatstone bridge circuit having the resistance value that changes proportionally based on the amount of displacement of the operation surface.

17. The pressing detector according to claim 16, wherein the pressing detection unit intermittently operates the Wheatstone bridge circuit by intermittently applying a drive voltage thereto.

18. The pressing detector according to claim 17, wherein the pressing detection unit is configured to continuously obtain pressing data from the piezoelectric element when the Wheatstone bridge circuit is not operating, such that the pressing detection unit can continuously correct the calculated and integrated value of the voltage generated by the electric charge generated by the piezoelectric element.

19. An electronic device comprising:
   a housing;
   an operation unit disposed in the housing; and
   a pressing detector attached to an inner wall surface of the operation unit, the pressing detector comprising:
      a piezoelectric element configured to generate an electric charge based on an amount of displacement of an operation surface;
      a displacement detection element configured to generate an output value based on the amount of the displacement of the operation surface; and
      a pressing detection unit configured to:
         calculate an integrated value of a voltage generated by the electric charge generated by the piezoelectric element,
         intermittently operate the displacement detection element, and
         correct the calculated and integrated value of the voltage based on the output value generated by the displacement detection element.

20. The electronic device according to claim 19, wherein the housing comprises a cylindrical shape with at least a portion of the displacement detection element curved along an inner surface of the cylindrical shape of the housing.

* * * * *